United States Patent
Tsironis

(10) Patent No.: US 9,647,629 B1
(45) Date of Patent: May 9, 2017

(54) VARIABLE CAPACITORS FOR HIGH ACCURACY TUNING

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 14/844,225

(22) Filed: Sep. 3, 2015

Related U.S. Application Data

(60) Provisional application No. 62/047,778, filed on Sep. 9, 2014.

(51) Int. Cl.
*H03H 7/38* (2006.01)
*H03H 7/40* (2006.01)
*H01G 5/06* (2006.01)

(52) U.S. Cl.
CPC ............... *H03H 7/38* (2013.01); *H01G 5/06* (2013.01); *H03H 7/40* (2013.01)

(58) Field of Classification Search
CPC ............... H03H 7/38; H03H 7/40; H01G 5/06
USPC ............... 333/32, 17.3, 263; 334/78, 81–83; 361/287, 289, 290, 292, 293, 294, 296, 361/298.1, 299.1
See application file for complete search history.

(56) References Cited

U.S. PATENT DOCUMENTS

| | | | | | |
|---|---|---|---|---|---|
| 2,723,348 | A | * | 11/1955 | Dreyer, Jr. ............ | H01G 5/38 334/45 |
| 4,025,882 | A | * | 5/1977 | Takeo .................. | H03J 1/14 334/45 |
| 7,224,241 | B2 | * | 5/2007 | Jue ...................... | H03H 7/40 333/32 |
| 7,646,267 | B1 | | 1/2010 | Tsironis | |
| 8,912,861 | B1 | * | 12/2014 | Tsironis ............... | H01G 5/06 333/17.3 |

* cited by examiner

*Primary Examiner* — Stephen E Jones

(57) ABSTRACT

Improved interdigital parallel plate rotary capacitors to be used in automatic MHz range tuners have a grounding technique based on bronze sliding contact to effectively and continuously lead to the ground terminal the rotating comb-like blades of the capacitor and (optional) damping resistors inserted between the sliding contact and the ground terminal. The resistors reduce the high Q of the series resonance of the capacitor with the fringe lead inductance. Tuning sensitivity is reduced and tuning accuracy and repeatability are increased.

8 Claims, 19 Drawing Sheets

Tunable impedances of segmented low frequency tuner for a distance between capacitor blocks equal to optimum λ/6

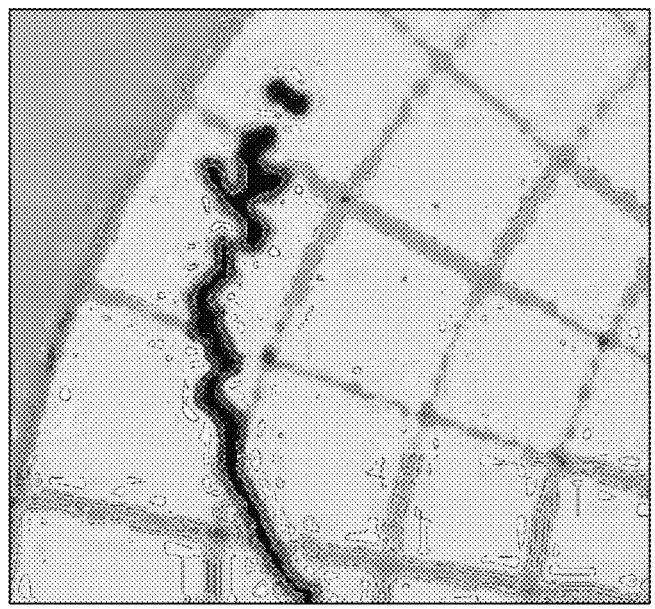
a)
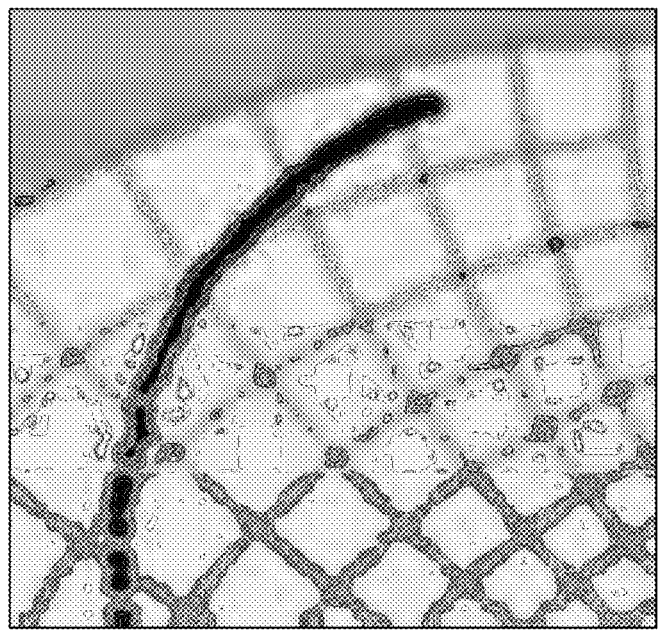
b)
FIG. 19

VARIABLE CAPACITORS FOR HIGH ACCURACY TUNING

PRIORITY CLAIM

This application claims priority to provisional application 62/047,778, filed on Sep. 9, 2014, titled "Variable Capacitors for high accuracy tuning".

CROSS-REFERENCE TO RELATED ARTICLES

1. Load Pull System: http://www.microwaves101.com/encyclopedia/loadpull.cfm
2. "Computer Controlled Microwave Tuner—CCMT", Product Note 41, Focus Microwaves, January 1998
3. Tsironis, U.S. Pat. No. 7,646,267; "Low frequency electro-mechanical impedance tuner"
4. Rotary Capacitor—http://en.wikipedia.org/wiki/Variable_ capacitor
5. High Deflection Clip On Series: http://omegashielding.com/category.php?id=75
6. Q factor of resonance: http://en.wikipedia.org/wiki/Q_factor
7. Transmission parameters: http://en.wikipedia.org/wiki/T_parameters

BACKGROUND OF THE INVENTION

Prior Art

This invention relates to high power (nonlinear) testing of RF transistors (DUT) in the frequency and time domain (see ref. 1) using Load Pull. Load pull is the method by which the load impedance presented to the DUT at a given frequency is changed systematically and the DUT performance is registered, with the objective to find an optimum tuning condition for certain overall design objectives. This may be maximum power, efficiency, linearity or else. The same is valid for the source side of the DUT. Passive (slide screw) tuners are used to emulate the various impedances presented to the DUT (see ref. 2) for frequencies above 100 MHz. For frequencies between 10 MHz and approximately 300 MHz another type of tuner is used (see ref. 3). This latter tuner structure uses commercially available variable (rotary blade) capacitors and fixed lengths of coaxial cable (FIG. 1).

Rotary capacitors (see ref. 4, FIG. 2) are made using sets of parallel metallic blades (24, 25) which are isolated electrically (22) and are inserted into each other by rotating one set (23); typically it is the rotating set (25) which is grounded (21) whereas the static set (24) is floating (FIG. 8). The grounding of the rotating set is made through the rotating axis (23) and the associated ball bearings and, occasionally, a sliding contact between the rotating axis (23) and the grounded walls (21). This grounding technique is very economic, but, for RF purposes, unreliable and it adds an electrical path (85) between the rotating blades and ground corresponding to a spurious inductance Ls. FIG. 3 shows an actual photograph of a typical rotary capacitor with a rotating axis (31) a grounded wall (32) and the rotating grounded set of blades (33) insertable interdigitally into the floating fixed set of blades (34).

Capacitors as shown in FIGS. 2 and 3 have fringe leading inductance (85) between the ground terminal and the rotating capacitor segment (Ls, FIG. 8). This creates a series resonance with the capacitor C itself at the resonance frequency $F_{res}=1/(2\pi\sqrt{LsC})$ (eq. 1). Because C is variable and Ls typically small and constant, this means that for any given Ls, there will be a, large enough, capacitance value C which will create a high Q series resonance at a frequency inside the test frequency range; or if there is such a resonance, it will appear at the high end of the capacitance value. The resonance has a high Q factor, because the circuit has no significant series resistance (or loss). Ls is typically very low, therefore, in order to create a resonance within the test frequency range capacitance values at the high end of the capacitance variation range are necessary. But when this happens, the response of the system is very critical and sensitive to minor disturbances (FIG. 10a).

Impedance synthesis is a technique using tuner pre-calibration. The data, measured using a network analyzer, must be saved in computer memory and recalled to be used during the load pull measurement. Also, in order to increase the impedance point tuning density, without unnecessarily calibrating more points and thus increasing calibration time, interpolation methods are used to compute the capacitor's (and eventually the tuner's) behavior, in form of two-port s-parameters. In other words, the repeatability and mechanical to RF continuity of the capacitor's behavior is critical: if the capacitors are not repeatable or if the capacitance "jumps" when the capacitor axis is rotated, neither the calibration data can be re-produced, nor is it possible to apply accurately interpolation techniques; this happens if there is intermittent discontinuity in the circuit and when the network includes high Q resonances (see ref. 3 and 6).

It has been found experimentally that the RF reflection factor created by capacitors as shown in FIG. 3 behaves erratically beyond a certain capacitance value (FIG. 4, areas (41, 42, 46)). In this area the mechanical repeatability of the capacitors and/or the mathematical interpolation between calibrated points offer in-sufficient accuracy for the purpose of the measurement system; in addition capacitors show a high residual reflection when in neutral state (45) instead of the ideal case (44); the explanation to this, last, behavior is that, the ground connection (81) between the rotating axis (87) and the ground terminal is too long and too parasitic (FIG. 8).

This document discloses modifications to commercially available rotary capacitors so that they change capacitance smoothly, predictably and repeatably and have low Q resonance behavior.

BRIEF DESCRIPTION OF THE DRAWINGS

The invention and its mode of operation will be better understood from the following detailed description when read when read with the appended drawings in which:

FIG. 19 depicts a direct comparison of reflection factor trace with increasing capacitance value at a fixed frequency: a) ungrounded-undamped capacitor; b) grounded and damped capacitor.

DETAILED DESCRIPTION OF THE INVENTION

The invention discloses a method to decrease the sensitivity of the impedance synthesis (tuning) created in low frequency (MHz range) tuners to mechanical imperfections of the rotary capacitors used. The method comprises two interventions in the structure of the capacitors: One is associated with better grounding and the other with lowering the quality (Q) factor of the capacitors at self-resonance.

Figure 2:
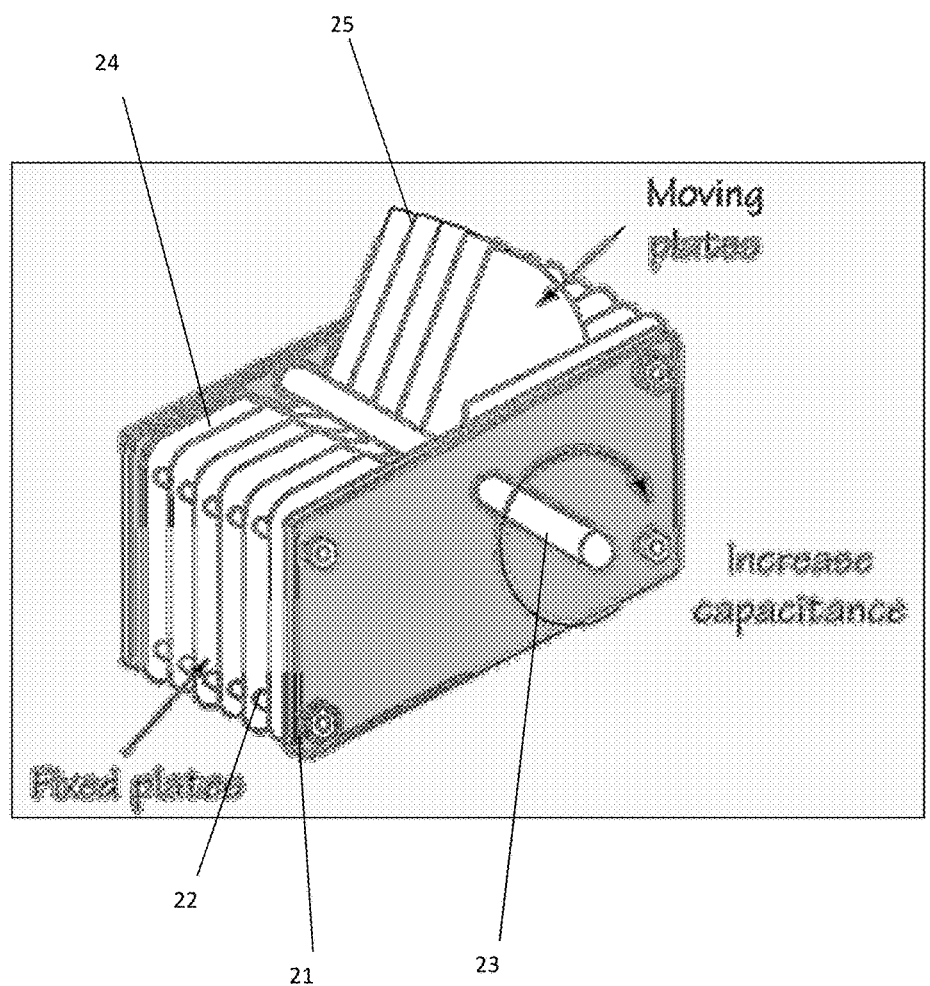
FIG. 2 depicts prior art, the perspective view and basic definitions of the parts of a parallel blade rotary capacitor (see ref. 4).
Figure 3:
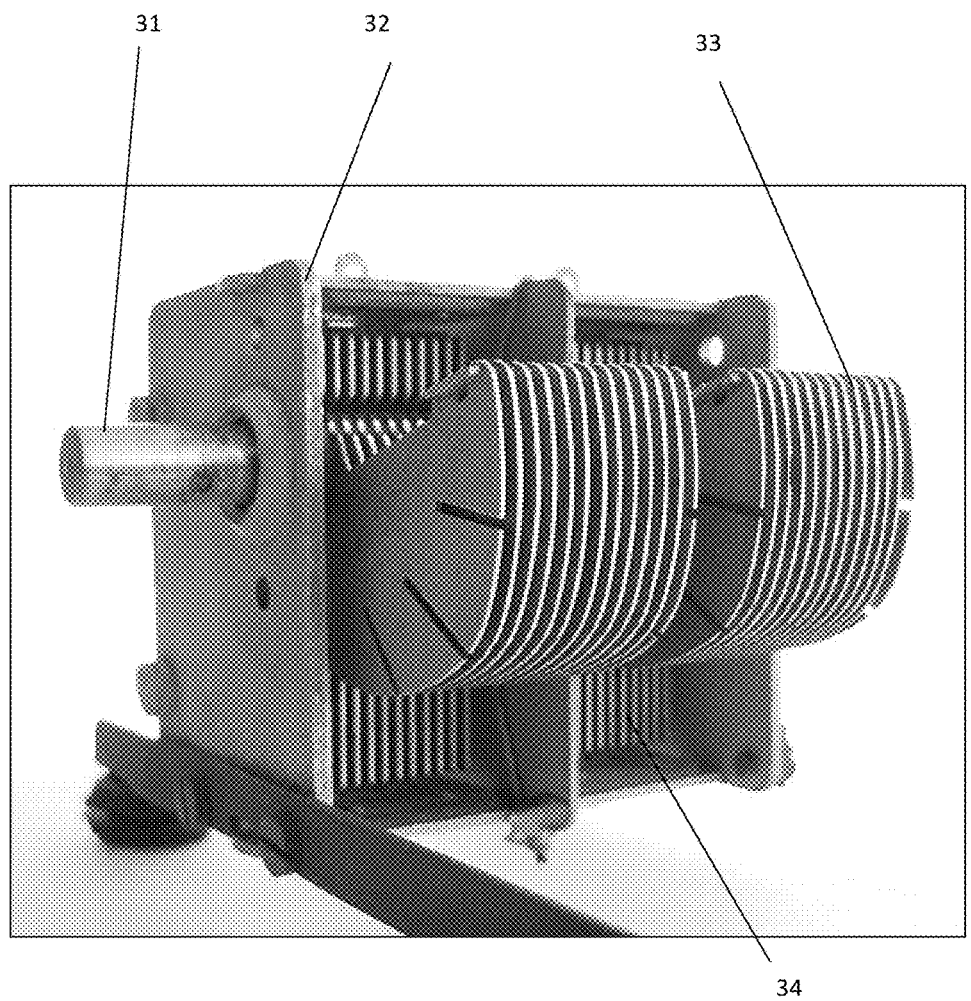
FIG. 3 depicts prior art, an actual photograph of a mechanically adjustable rotary capacitor.
Figure 4:
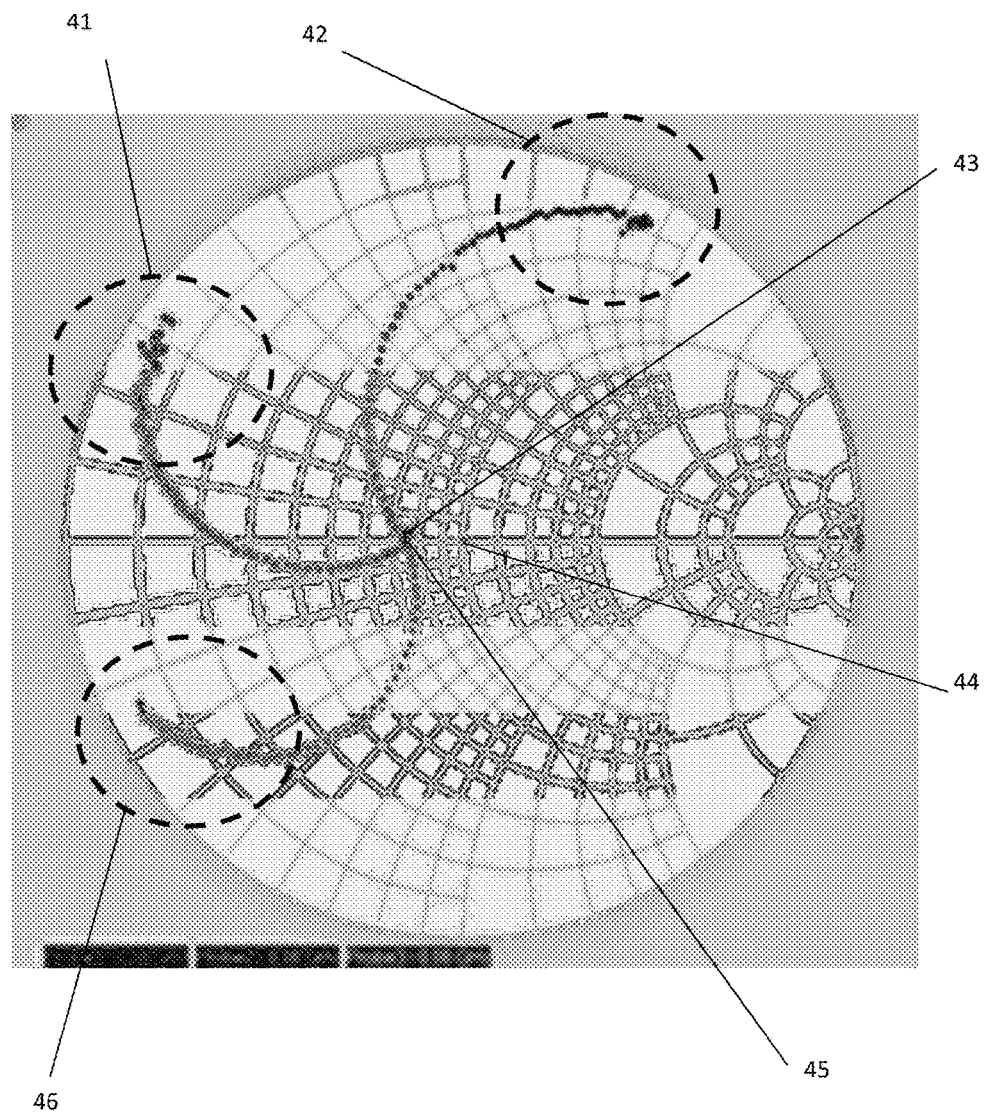
FIG. 4 depicts prior art, the reflection factor of individual capacitors used in a tuner assembly (as FIG. 1); the traces shown correspond to reflection factor at the tuner test port measured as each capacitor is varied individually between the minimum and maximum value, whereas all other capacitors are set to their minimum value (neutral state).
Figure 6:
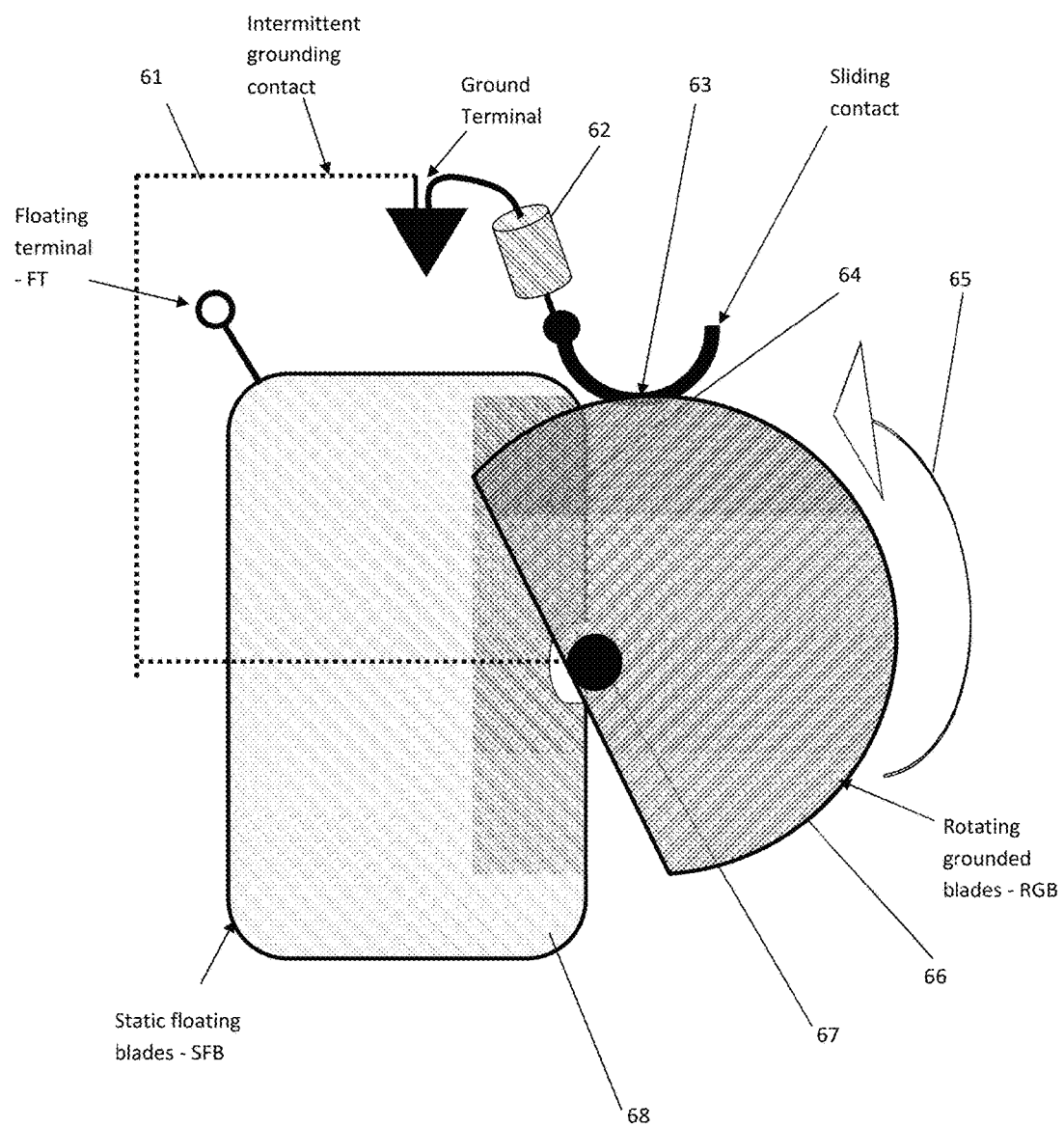
FIG. 6 depicts schematics of a rotary capacitor with improved grounding contact (63) and damping resistor (76).

The rotary capacitors used are shown in FIGS. 2 and 3. As already mentioned the sliding ground continuity of these capacitors is insufficient, leading to impedance jumping when tuning (41) in FIG. 4. The fact that, as shown in FIG. 4, the impedance jumping occurs mostly at high capacitance values, i.e. when the rotating blades (33) in FIG. 3 and (66) in FIG. 6 are close to overlapping the floating fixed blades (68) in FIG. 6, (34) in FIG. 3, leads to the conclusion that the irregularity is related also to the self-resonance of the capacitors.

In an ideal series LC circuit, as is the capacitor C including its leading spurious inductor Ls (see FIG. 8); the resonance frequency can be calculated as Fo=Fres=$1/(2\pi*(Ls*C)^{1/2})$; Fres=$1/(2\pi*\omega_o)$; or, because of the low value of Ls, the resonance frequency is reached at the highest capacitance value. In a more realistic case, in a circuit with the same resonance frequency, where some series resistor R (corresponding to ohmic loss) is included the Q factor can be calculated as (see ref. 6):

$$Q = \frac{1}{R}\sqrt{\frac{L}{C}} = \frac{\omega_0 L}{R} \quad (\text{eq. 2})$$

Figure 8:
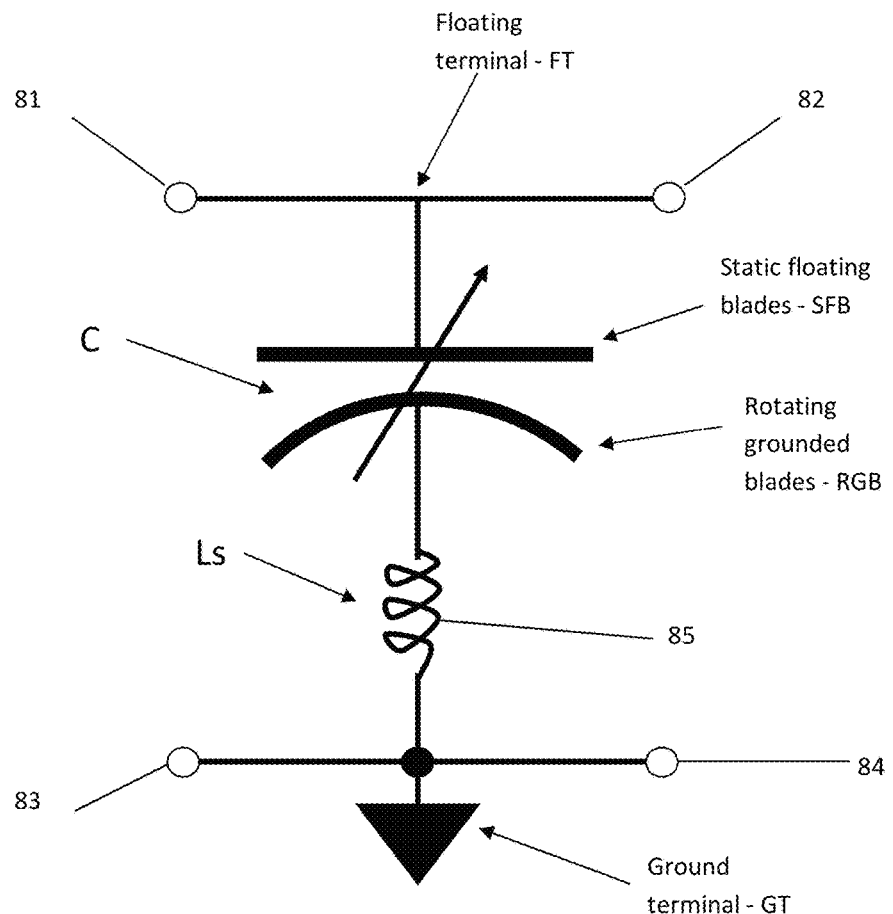
FIG. 8 depicts prior art: the electrical equivalent circuit of a rotary capacitor.
Figure 9:
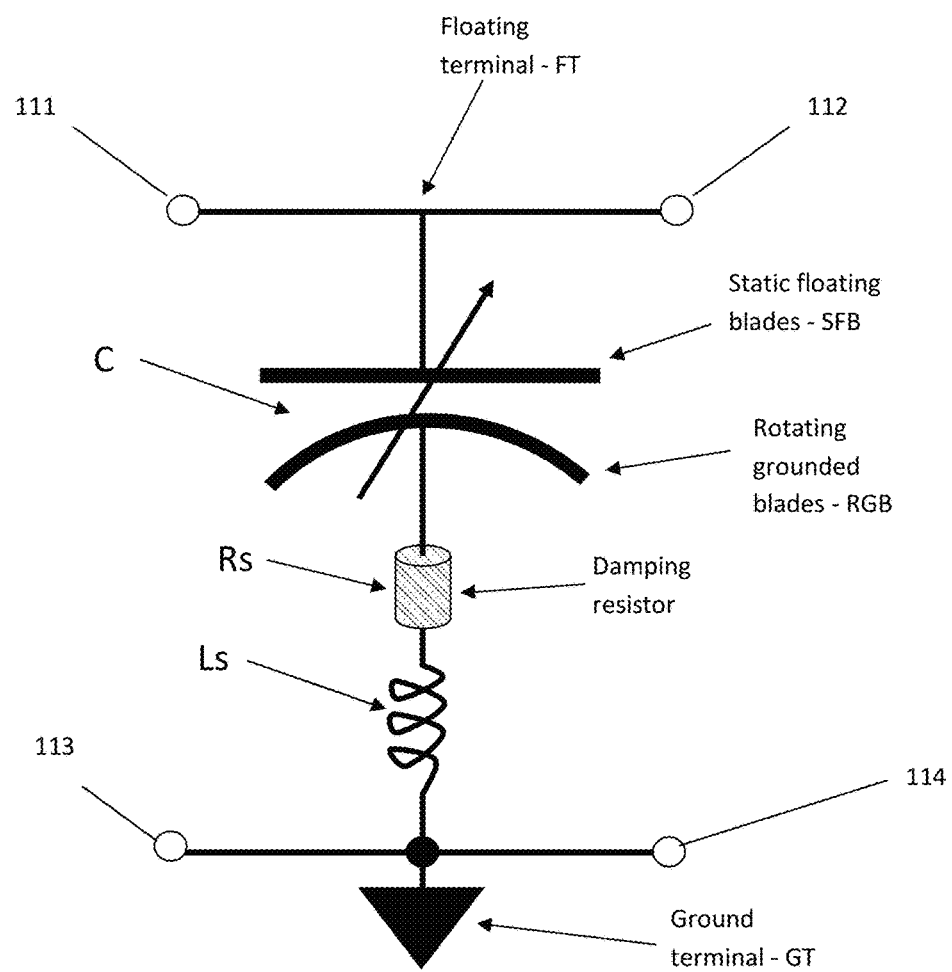
FIG. 9 depicts the electrical equivalent circuit of a rotary capacitor including a damping resistor.

This means that the (ideal) circuit of FIG. 8 has a Q factor of infinite (since R=0), which is, of course non-realistic, but, even if Q is simply very high, it is still inacceptable, since it makes the circuit extremely sensitive to changes in the frequency or its component's values. Introducing a series resistor Rs (FIG. 9) will reduce the Q factor. Component changes are the repeatability errors in the capacitance setting, being this due to mechanical gear error in setting the exact angle of the rotating blades or the erratic ground contact; whereas the erratic nature of the ground contact can be cured to a large extent by the sliding grounding contact, the mechanical repeatability error cannot; this must be done through the damping resistor and lowering the Q factor.

Figure 10:
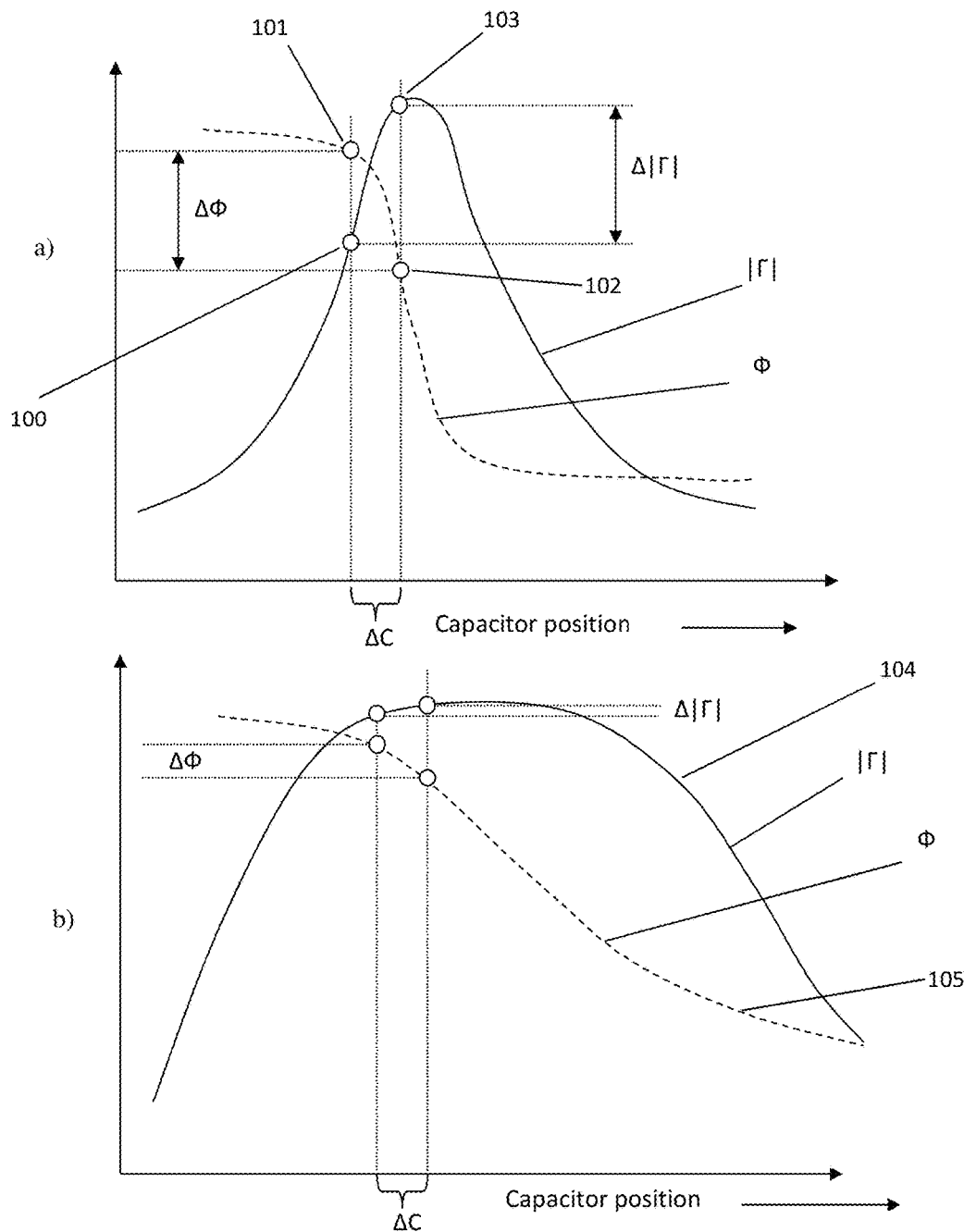
FIG. 10 depicts the electrical behavior of high Q (a) and low Q (b) capacitor self-resonances.

The actual resonance behavior of both circuits is shown in FIGS. 10a) and 10b). Resonance curves are shown, typically, for networks with fixed components as a function of frequency. And thus is the Q factor defined: Q=Fres/ΔF (eq. 5), whereby ΔF is the frequency bandwidth for which the response drops by 3 dB. In our case, though the components of the network are not constant, the capacitors are variable and not 100% mechanically repeatable: i.e. even if the capacitor setting is the same, after a movement, a small variation ΔC is possible. In that respect the resonance frequency: Fo=$1/(2\pi*\sqrt{(LsC)})$ will change to Fo+ΔF=$1/(2\pi*(Ls*(C+\Delta C))^{1/2})$, or ΔF=$-1/(4\pi*Ls^{-1/2}*C^{-3/2})*\Delta C$, (eq. 3) or the Q factor will be: Q=2/(C*ΔC), (eq. 4). This is shown in FIG. 10a). The inaccuracy occurs when the capacitor's small change causes a shift in resonance frequency: the phase of the reflection factor changes by ΔΦ between points (101) and (102) and the amplitude by Δ|Γ| between points (100) and (103).

The sensitivity in rotation is easy to estimate. Typical stepper motors have a step size of 1.8° or 200 steps per revolution (360°). The rotary capacitor varies from Cmin to Cmax in 180°, or 100 steps. Therefore the capacitance step is Cstep=0.01*(Cmax−Cmin). A rotation positioning error of ±0.1° then corresponds to $\frac{1}{8}^{th}$ of Cstep: ΔC=0.00112*(Cmax−Cmin); this value can be used in equation 3 to calculate the error in resonance frequency and thus in Φ and Γ. For a typical setting of C=50 pF, Ls=20 nH (Fres=50 MHz) the resonance error is 60 kHz, or 1.2 per thousand of Fres, or close to 3 dB amplitude error in |Γ| and close to 45° error in phase for a Q factor of 700 as follows from equation 5. Using a resistor R=5Ω in equation 2 will reduce Q to 700/5≈120 and increase the tuning accuracy by 20 log (5)≈15 dB.

When the capacitor is damped (FIG. 9) using a series resistor (Rs) in the grounding path, the resonance response takes a typical form as shown in FIG. 10b). This means that, for the same imperfection in capacitor setting (ΔC) the corresponding phase and amplitude errors in reflection factor are on the traces (104) and (105) whereby, compared with FIG. 10a: ΔΦ(b)<<ΔΦ(a) and ΔΓ(b)<<ΔΓ(a). The overall response can be seen in detail in FIG. 19. FIG. 19a) is the response of the undamped raw capacitor, as available commercially, whereby FIG. 19b) shows the same response of the same capacitor after it has been grounded and damped as disclosed here.

Figure 16:
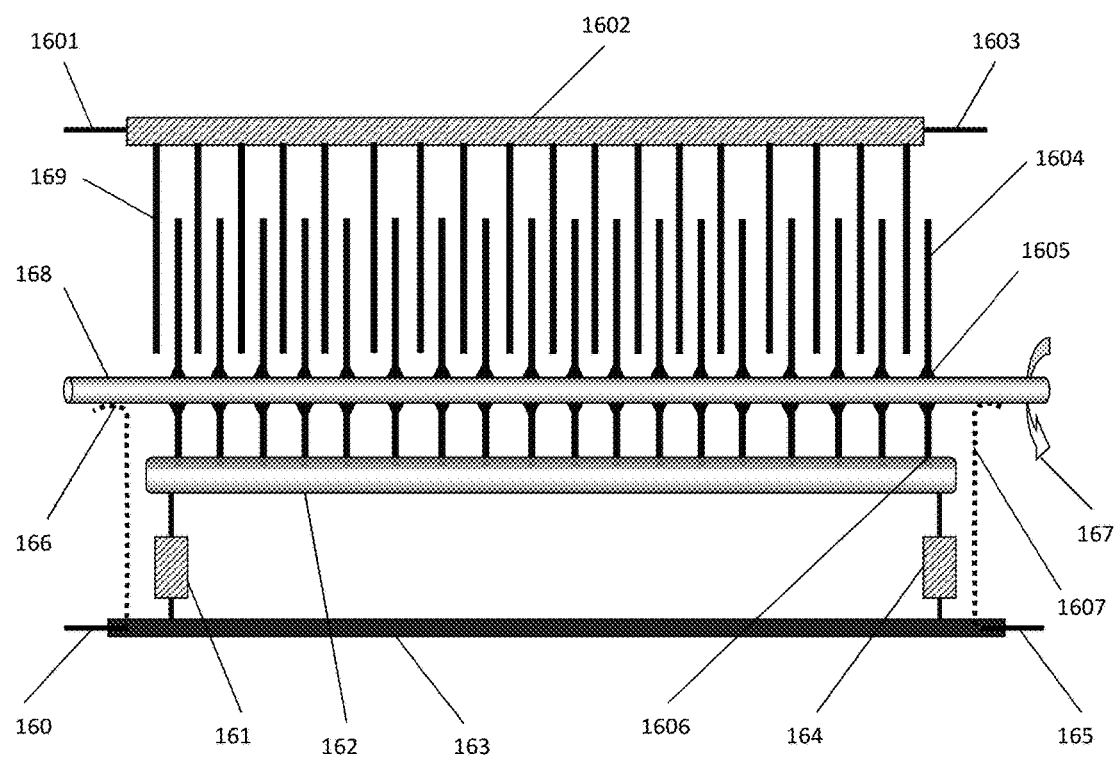
FIG. 16 depicts schematics (cross section) of the rotary capacitor including sliding grounding contact and two damping resistors at the ends of the sliding contact.
Figure 17:
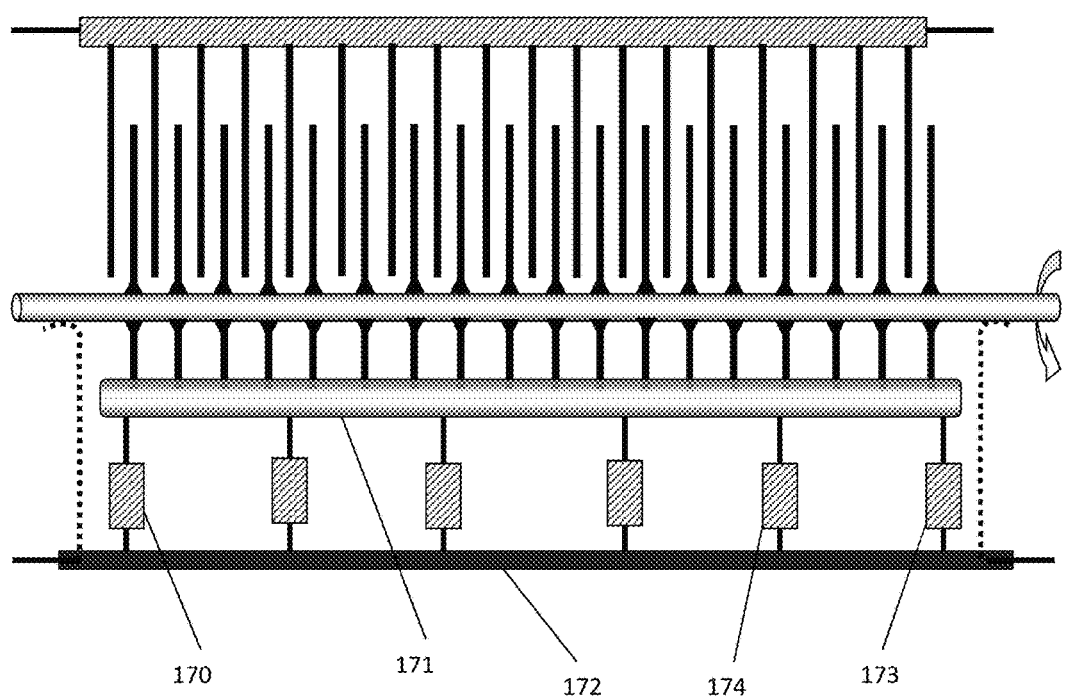
FIG. 17 depicts schematics (cross section) of the rotary capacitor including sliding grounding contact and an array of damping resistors distributed over the sliding contact.
Figure 18:
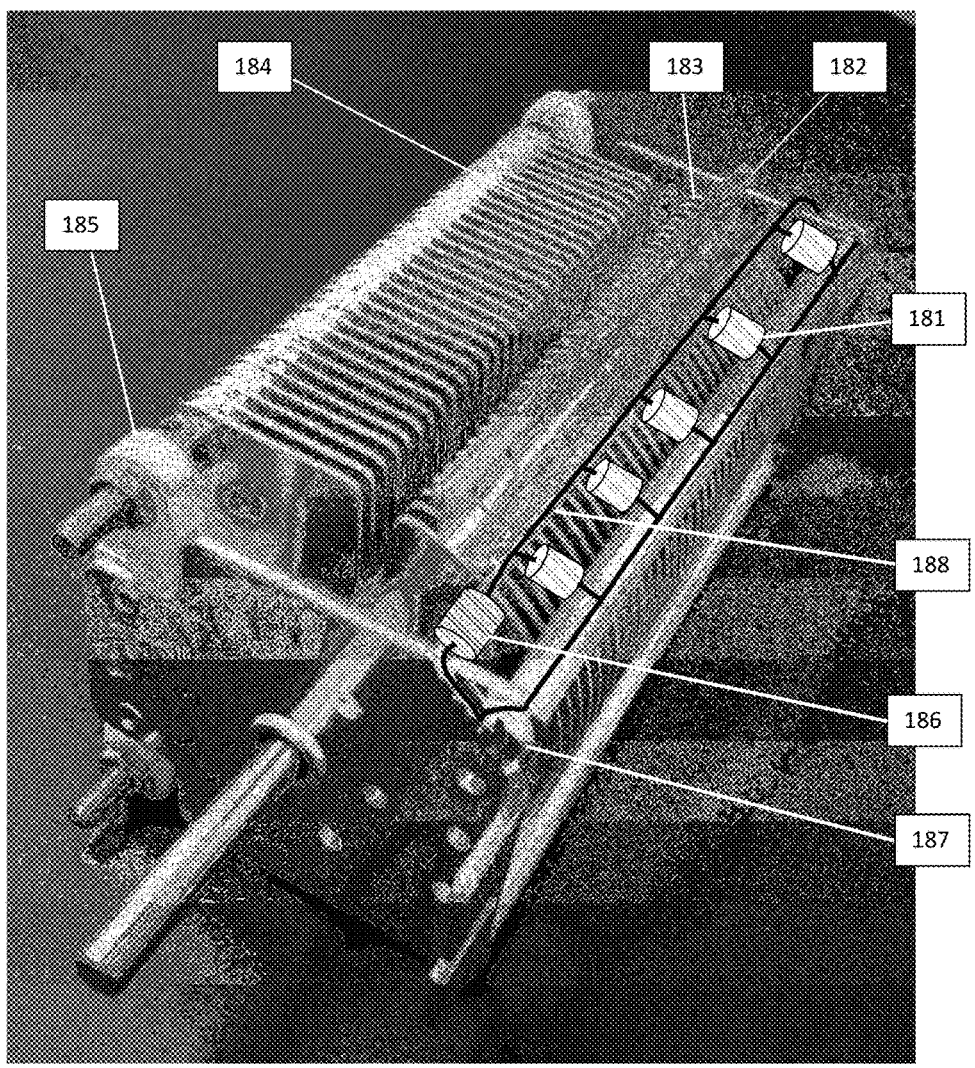
FIG. 18 depicts photograph of the rotary capacitor including sliding grounding contact and an array of damping resistors distributed over the sliding contact.

The implementation of the damping resistors is shown in FIGS. 16 to 18: In FIG. 16 two resistors (161) and (164) are inserted between the sliding contact (162) and ground (163). The rotating plates (1604) which generate the adjustable capacitance by being inserted in a contactless manner into the set of floating plates (169) which are attached to the floating terminal (1602), are conductively attached to the rotating axis (168), which has sliding contact with the bronze shim (162), (see ref. 5). This method established a continuous contact, replacing the intermittent contact (166) and (1607) of the typically available grounding path in commercially available capacitors.

In FIG. 17 the damping resistors (170), (173), (174) etc. are distributed over the whole length of the sliding contact (171) to establish a distributed grounding (172). Distributing the resistors over the grounding contact ensures less intermittence in grounding continuity in case individual sliding segment contacts fail.

FIG. 19 shows the effect of improved grounding and damping the rotating comb-like set of blades; as is immediately visible the reflection factor at high capacitance values is smooth and continuous. The residual reflection factor when the capacitance is in the neutral minimum, state is also exactly at the center of the Smith chart (52) which means that the grounding also eliminates parasitic elements (85) associated with the insufficient grounding of the unmodified capacitors, FIG. 8.

Figure 7:
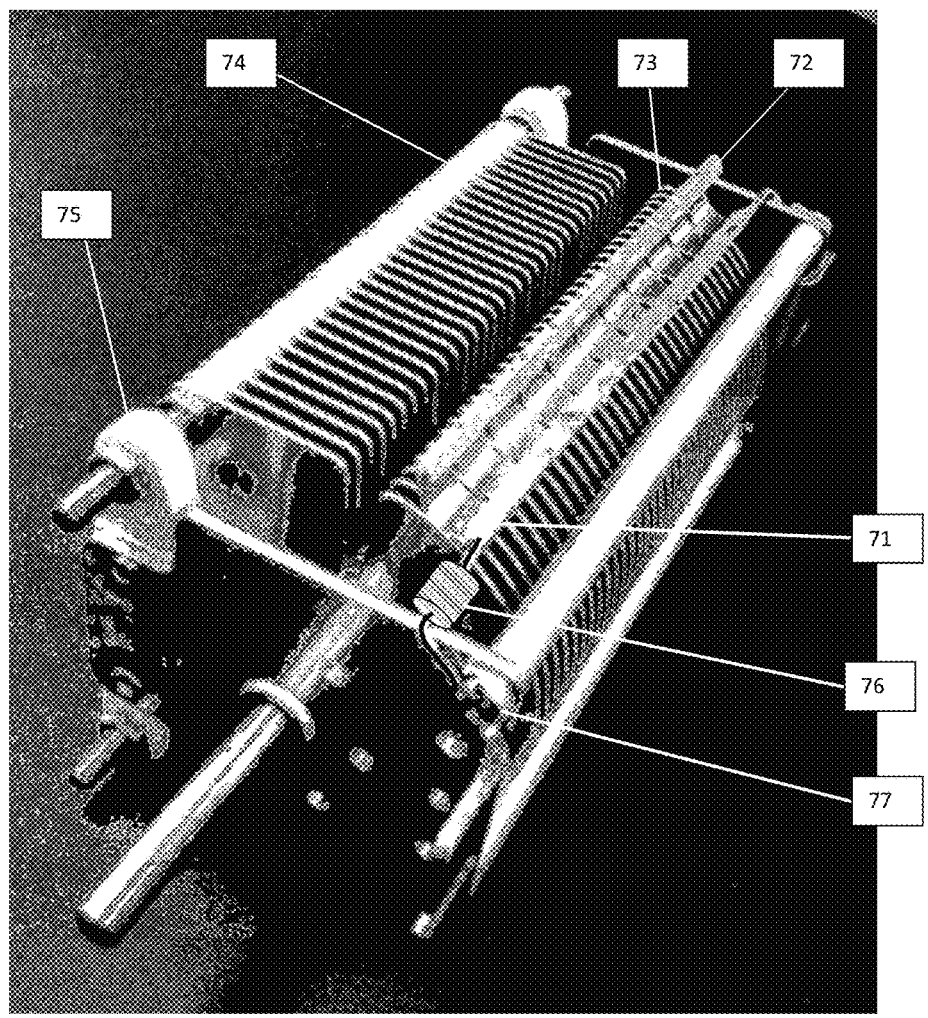
FIG. 7 depicts a photograph of a rotary capacitor modified per FIG. 6.

The grounding technique through the bronze filament (72) which extends over the entire width of the rotating set of blades (FIG. 7) adds an effective and self-polishing way of continuous grounding of each individual blade (73). This sliding contact on the edge of each blade also eliminates any corrosion or dirt deposits that might surface during the operation. The short grounding wire (76) ensures continuous grounding for this MHz frequency range.

Figure 14:
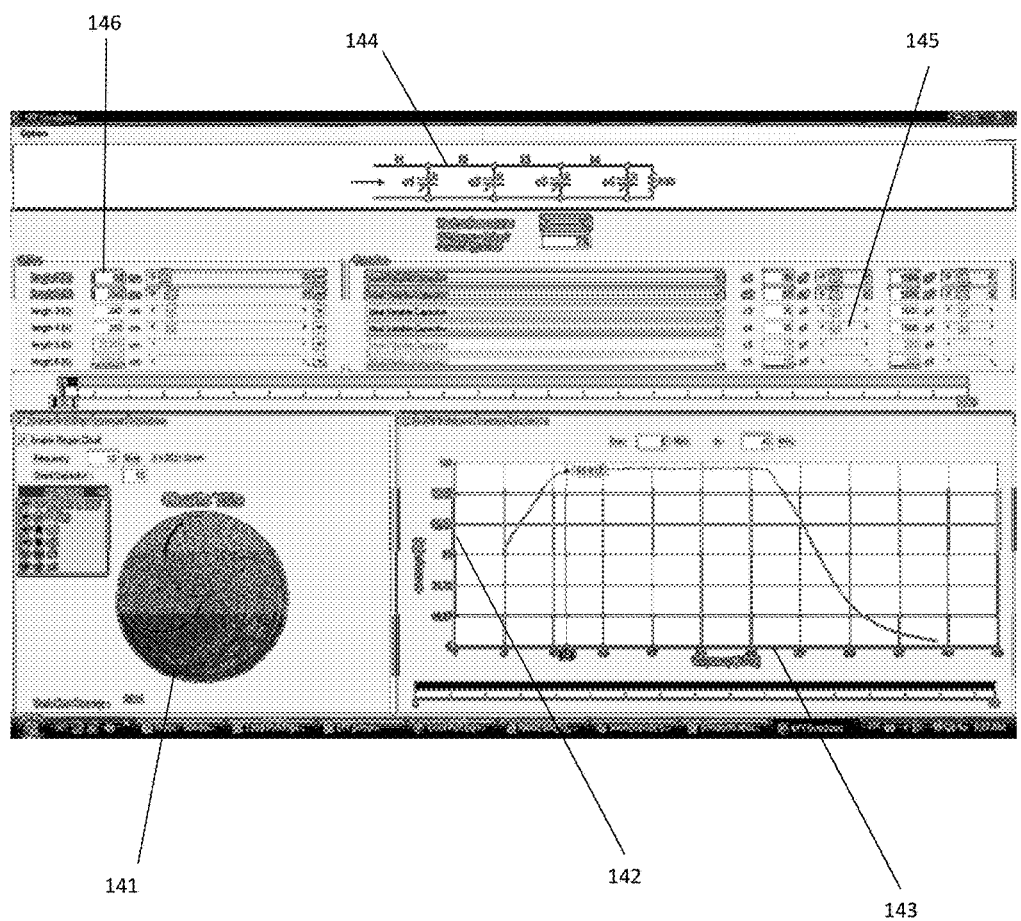
FIG. 14 depicts model calculations and wideband optimization of a four capacitor tuner, using capacitors as in FIG. 7.

FIG. 14 depicts a model and network calculation and optimization of impedance tuners using a cascade of a number of tuning sections, each section comprising a variable shunt capacitor and lengths of coaxial cable interconnecting with the other sections (144); the model is used to calculate the reflection factor response (141) of the tuner network and vary (optimize) the lengths of said cables (146) in order to reach maximum GAMMA coverage (142) over a required frequency range (143) using all possible permutations of capacitor settings; the capacitor values used in the model are entered in form of measured s-parameters of individual shunt capacitors measured as individual two-ports (FIG. 8) over the frequency range for a number of settings between minimum and maximum capacitance.

Figure 15:
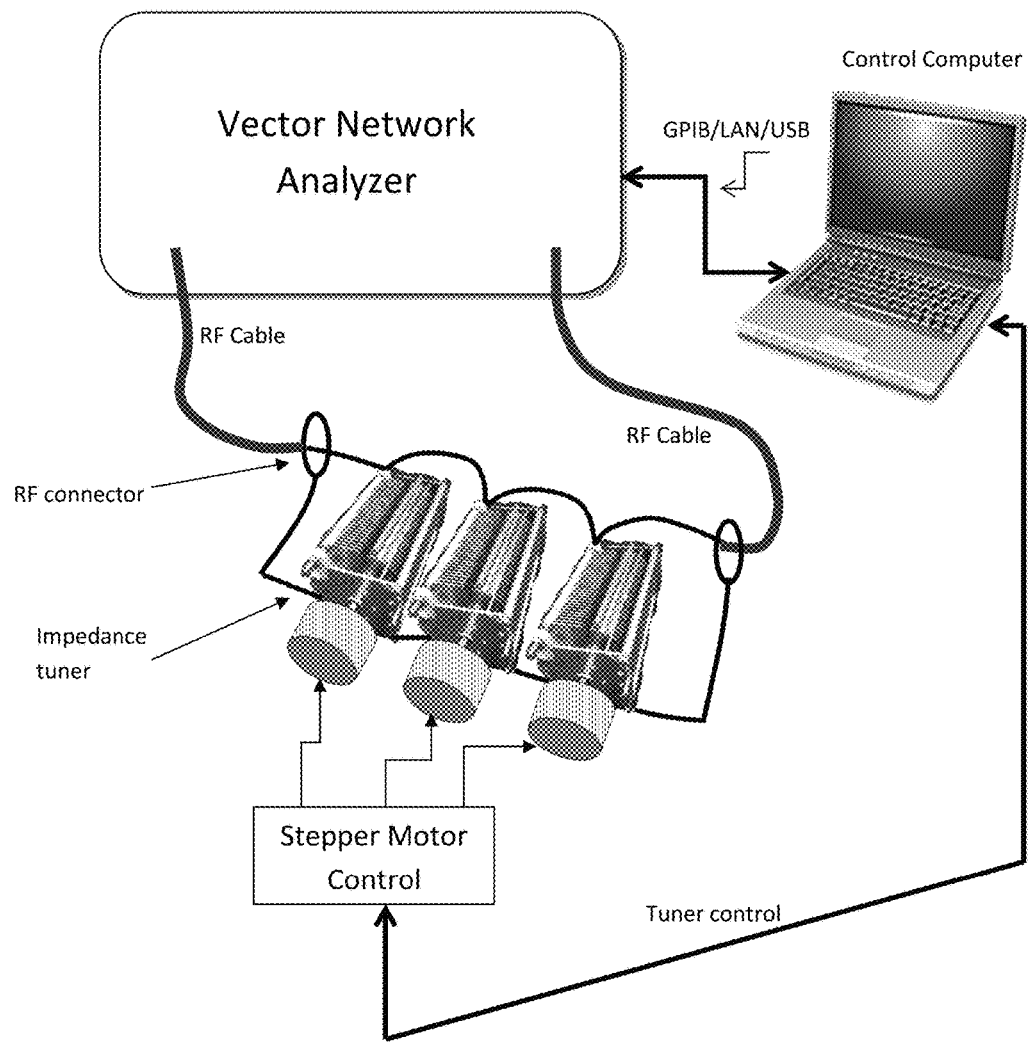
FIG. 15 depicts a setup for calibrating the tuner of FIG. 12.

FIG. 15 shows a tuner calibration setup, comprising the tuner two-port itself, connected using RF cables to a pre-calibrated vector network analyzer and a control computer; said control computer sets the tuner states by adjusting the stepper motors, and measures the tuner two-port s-parameters using the network analyzer, saves temporarily the data, makes all necessary calculations and matrix permutations and corrections and saves the data in calibration files.

The actual problem with the original capacitors occurs, as already mentioned before, when the capacitors move; in a static situation the capacitance created is sufficient; but when the tuner using the capacitors is calibrated and the calibration points are used to interpolate between capacitor settings (to increase the tuning resolution) then the discontinuity due to high Q factor and intermittent grounding contact is not tolerable. This is shown in FIG. 19*a*).

Figure 1:
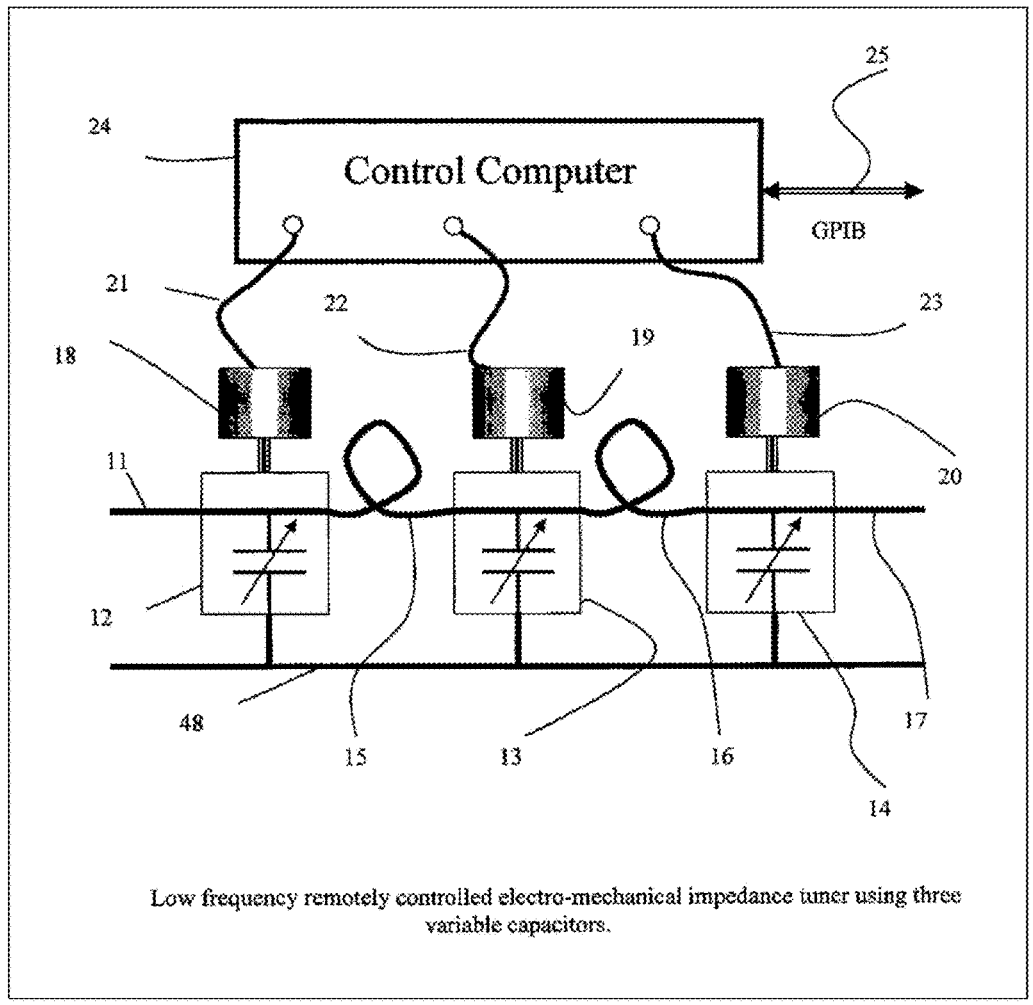
FIG. 1 depicts prior art, the concept and electrical model of an impedance tuner using three variable shunt capacitors and lengths of cable connecting them in cascade (see ref. 3).
Figure 13:
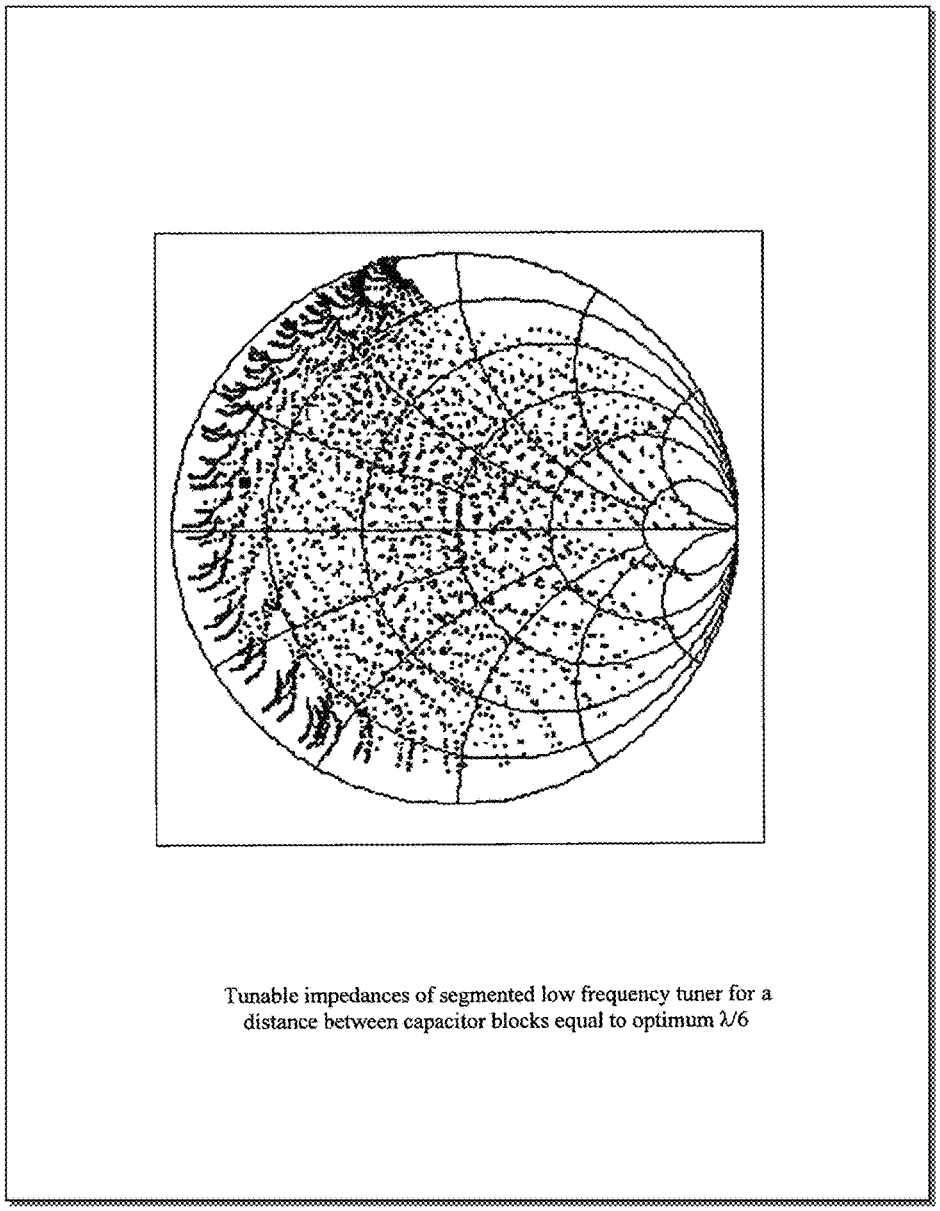
FIG. 13 depicts the tuning points created by a three capacitor tuner, as shown in FIG. 12.

An impedance tuner using rotary capacitors and fixed lines of transmission cable (see ref. 3) requires at least three tuning sections, each section having one variable capacitor and one section of coaxial cable, connecting to the next stage (FIG. 1); as can be seen from FIG. 13, if the reflection vectors of the tuning sections are arranged properly, the whole, or the largest part of the Smith chart can be covered by adjusting the amplitude of tuning vectors relative to each-other. When four tuning sections are used (FIG. 14) then an even better coverage is possible.

Figure 11:
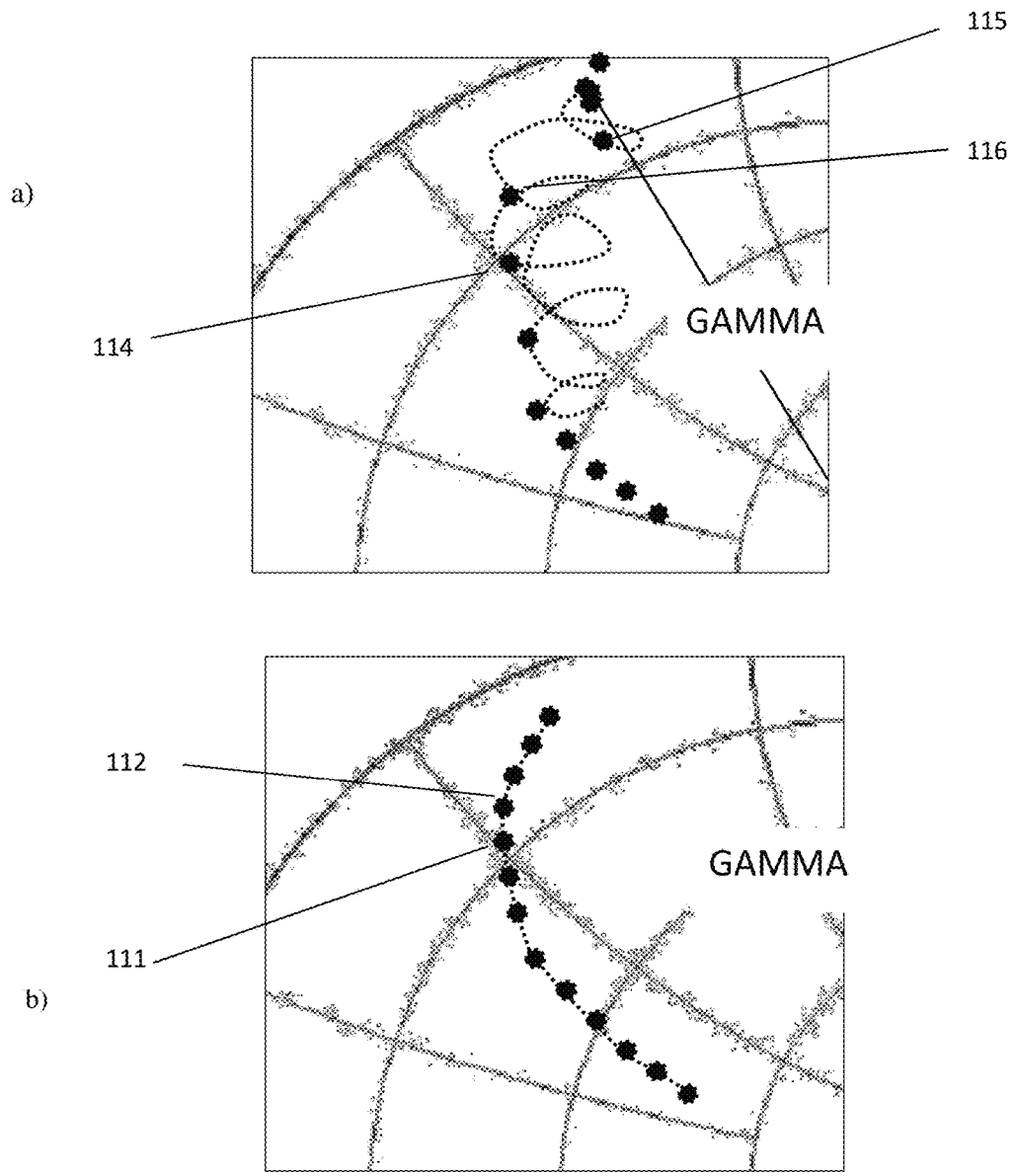
FIG. 11 depicts the reflection factor response of rotary capacitors: (a) unmodified capacitor; (b) capacitor with improved grounding and damping resistor; compare with FIGS. 4 and 5.

A network simulation method and algorithm are used to optimize the length of interconnecting cables (144) for a selected set of capacitors, in order to maximize the tuning range on the Smith chart (141) and the continuous bandwidth coverage (143) of the multi-capacitor LC tuner (FIG. 14). In this algorithm the measured capacitance values are used as two-dimensional sets of s-parameters [S(i,F)], whereby "i" is the motor steps (=angle of rotating set of blades) and "F" is the frequency. The s-parameter sets are measured between the input (111, 113) and output (112, 114) ports of the shunt capacitors, (FIG. 11), for minimum to maximum capacitance settings in a number of steps and as a function of frequency over the desired frequency range (145). The algorithm calculates all possible reflection factor permutations and displays a "coverage percentage number in %" (142), corresponding to the proportion of the circle area (Smith chart) coverable (141) by a combined setting of the associated capacitances (145) and the interconnecting coaxial cable lengths (144, 146). The algorithm then optimizes the length of the cables in order to reach a maximum Smith chart coverage over the desired frequency range.

Figure 12:
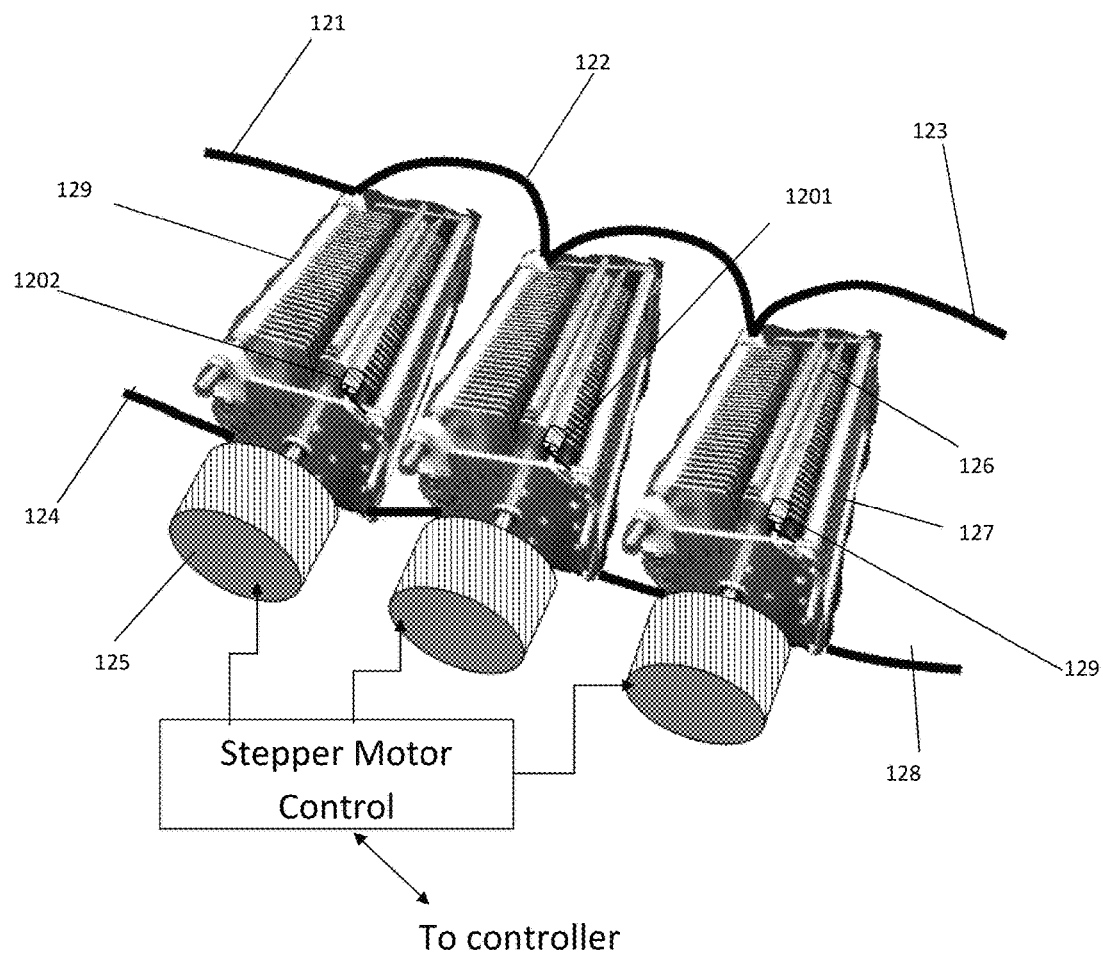
FIG. 12 depicts a tuner using three modified shunt capacitors, including better grounding and damping resistor.

The benefit of the hereby disclosed capacitor grounding and Q factor damping method lies in better accuracy and repeatability of the RF reflection factor, rather than a higher Smith chart coverage (tuning range), as is obvious from FIGS. 19*a*) and 19*b*). Such an impedance tuner is shown, schematically in FIG. 12; it comprises three grounded rotary capacitors (129), has an input port (121, 124), an output port (123, 128) and sections of coaxial cable (122) connecting in cascade the floating terminals of said capacitors. The capacitors are controlled by stepper motors (125), which are driven by an electronic circuit board and a data processor (controller resp. computer). Stepper motor control being obvious off-the-shelf material is not shown here in more detail. The three capacitors (129) of this tuner have all been modified using the hereby disclosed grounding technique, with the grounded bronze sliding contact (126) (see ref. 5).

To be used in tuning operations and load pull measurements the tuners must be calibrated. Calibration consists in connecting the tuners to pre-calibrated network analyzers using high quality RF cables and measuring the tuner two-port's s-parameters for various capacitor settings (FIG. 17). There are two possibilities: (a) the direct method and (b) the de-embedding method.

The direct method consists in calibrating all N possible permutations of capacitor settings, whereby $N=A^M$, with A being the number of capacitor settings (typically 10 to 20) and M is the number of tuning sections (capacitors), typically 3, 4 or 5; i.e. a three capacitor tuner (M=3) calibrated at A=10 capacitor settings would have to be calibrated at 1,000 points; a four capacitor tuner (M=4) calibrated at A=20 capacitor settings would have to be calibrated at 160,000 points. This example shows the limits of the direct method.

Figure 5:
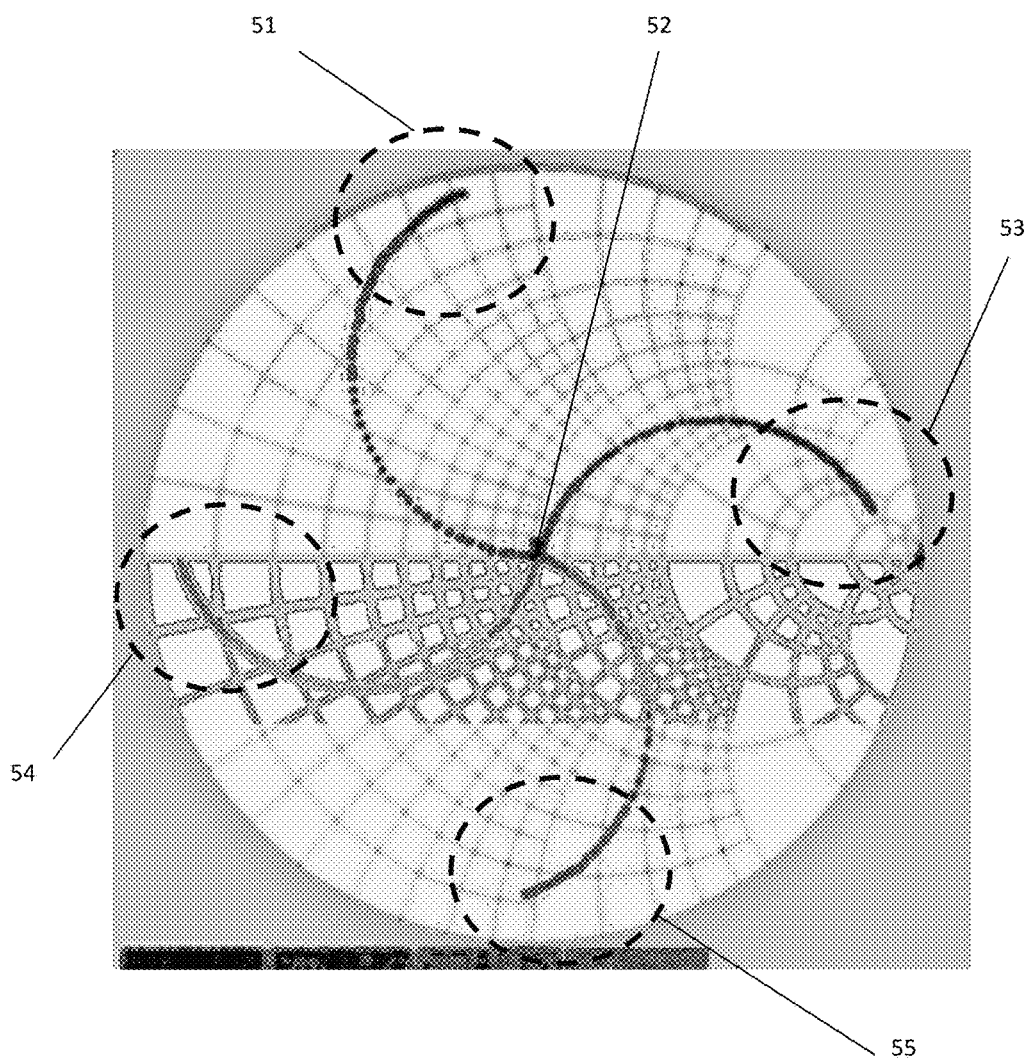
FIG. 5 depicts the reflection factor of a four capacitor tuner, using the same concept as FIG. 1, measured as in FIG. 4, whereby the capacitors have been modified using the improved grounding method and resonance damping resistors, depicted in FIG. 6 (items (63) and (62)), and FIG. 7 (items (71) and (76)).

The de-embedding tuner calibration method consists in calibrating the tuner at a number of states N=A*M, whereby A and M are as defined before. In this case the first tuner (3 stages at 10 settings per stage) needs to be calibrated at 30 capacitor settings (instead of 1,000) and the second one (4 stages at 20 settings each) at 80 capacitor settings (instead of 160,000); the required data for 1,000 respectively 160,000 sets of s-parameters are then generated very rapidly in computer memory by cascading the measured sets of s-parameters. This is far more efficient than time consuming measuring of thousands of points. For the de-embedding calibration to work, the measured s-parameters of all tuning sections, except for the first section, must be de-embedded (cascaded with the inverse matrix) by the s-parameter matrix of the "neutral" tuner two-port, measured when all capacitors are in the neutral state (minimum capacitance, point (52) in FIG. 5).

The de-embedding method can be described as follows:

a) measure two-port s-parameters matrices for a number of settings "j" of each capacitor Ci (i=1, 2, 3 . . . ) individually, between the minimum and maximum capacitance value, whereby "j" is typically between 5 and 20, all other capacitors being set to their minimum capacitance setting (neutral state), and save in file [Sij];

b) measure the s-parameter matrix of the tuner two-port with all capacitors in their neutral state and save in file [S0];

c) de-embed all s-parameter matrices [Sij] for i>1, by cascading with the inverse matrix $[S0]^{-1}$ and save in matrices [Sij'], whereby [S1j']=[S1j], $[Sij']=[S0]^{-1} \times [Sij]$;

d) cascade s-parameters of all permutations of all capacitor settings of all matrices [Sij'] and save in a tuner calibration file ready for retrieval.

Hereby the symbol "x" between matrices ([Sa]×[Sb]) means "cascading": S-parameter matrices must be converted to T-parameters (transmission parameters) then multiplied and converted back to s-parameters (see ref. 7). It is obvious to anybody basically versed in mathematical interpolations that, in the case of the un-modified capacitor (FIG. 11*a*) interpolation beyond the calibration point (114) is quasi meaningless. Points (115) and (116) etc. cannot really be described using a polynomial or other simple mathematical relation. On the other hand points (111) and (112) etc. of the modified capacitor and the capacitor states between them can easily be described (as a function of the rotation of the set of blades) using simple linear relations in a Cartesian space, such as:

$X(i)=X(i-1)+\partial X/\partial i * \Delta i$; and $Y(i)=Y(i-1)+\partial Y/\partial i * \Delta i$;

whereby "i" is be the number of the motor steps rotating the mobile blades of the capacitor (86), X(i) and Y(i) are the real and imaginary parts of the complex reflection factor GAMMA(i)=X(i)+jY(i), shown on the Smith chart (FIG. 12 *b*) and $\partial X/\partial i$ and $\partial Y/\partial i$ the gradient of the real and imaginary part of said reflection factor as a function of the number of motor steps "i" with increasing overlapping (84) of the rotating mobile blades (85) with the static ones (88). $\partial X/\partial i$ and $\partial Y/\partial i$ can, in this case, easily be calculated from the linearly changing slope of the previous set of calibration points, such as shown in FIG. 11*b*:

$\partial X/\partial i=(X(i)-X(i-k))/k$; $\partial Y/\partial i=(Y(i)-Y(i-k))/k$; whereby "k" is the number of motor steps between two successive calibration points (or capacitor settings) and X(i) and Y(i) are the measured values of real and imaginary parts of GAMMA (equal to the s-parameter S11 measured by the calibrated network analyzer used). The interpolation method is applied equally to the transmission factors S21(*i*)=S12(*i*) and the output reflection factor S22(*i*) using the same relations. The four s-parameters of each tuning capacitor section are necessary in order to be able to cascade the associated S-parameter matrices making up the tuner network.

The above described simple relations allow an accurate description of the RF behavior of the modified capacitors as shown in FIGS. 16 to 18 between calibration points, and yield, therefore, reliable and repeatable impedance synthesis (tuning) and load pull operations with tuning resolution higher than the calibrated points alone. The reduced number of calibration points is used in order to allow for a faster calibration procedure and is acceptable as long as (a) the reflection factor behaves smoothly (FIG. 11*b*)) and (b) the interpolation method yields accurate results.

Obvious alternative grounding and damping methods and interpolation algorithms, including modified components, of the above method are imaginable but shall not impede on the validity and general coverage of the claims of the hereby described concept of improving the RF behavior and tuning continuity of rotary capacitors using a sliding ground filament making sliding contact with and grounding the rotating capacitor blades.

What I claim is:

1. Rotary blade variable capacitors for impedance tuners,
    said tuners comprising three or more said capacitors interconnected using lengths of coaxial cable,
    whereby said capacitors comprise a grounding contact, sliding on the rotating blades;
    and damping resistors between the sliding contact and ground.

2. Rotary capacitors as in claim 1, having a floating fixed and a grounded rotating set of interdigital blades,
    and a conductive contact sliding on the edges of the rotating mobile blades;
    and having damping resistors attached to the sliding contact and leading to ground terminal.

3. Rotary capacitors as in claim 2 having damping resistors connected at both ends of said sliding contact leading to the ground terminal.

4. Rotary capacitors as in claim 2 having an array of multiple damping resistors distributed over the length of said sliding contact.

5. A tuner as in claim 1, whereby the lengths of said interconnecting cables are optimized using a network simulation and optimization software algorithm,
    whereby said algorithm calculates the reflection factor of a cascade of variable shunt capacitors interconnected using numerically adjustable lengths of coaxial cable, as a function of capacitance value and frequency,
    whereby said capacitors are represented by sets of measured s-parameters for a number of capacitance settings between the minimum and maximum values, and
    whereby the lengths of interconnecting cables and capacitor s-parameter sets are optimized in order to reach a maximum Smith chart coverage over a given frequency band.

6. A calibration method for tuner as in claim 5,
    whereby the tuner two-port s-parameters are measured at a given frequency using a pre-calibrated vector network analyzer for a multitude of settings of each capacitor, between the minimum and maximum capacitance value and for all possible permutations of capacitor settings of all capacitors,
    and whereby all sets of s-parameters and associated capacitor settings are saved in tuner calibration file ready for retrieval.

7. A calibration method for a tuner as in claim 5,
    whereby the tuner two-port s-parameters are measured at a given frequency using a pre-calibrated vector network analyzer as follows:
    a) measure two-port s-parameters matrices for a number of settings "j" of each capacitor Ci (i=1, 2, 3 . . . ) individually, between the minimum and maximum capacitance value, all other capacitors being set to their minimum capacitance setting (neutral state), and save in file [Sij], b) measure the s-parameter matrix of the tuner two-port with all capacitors in their neutral state and save in file [S0], c) de-embed all s-parameter matrices [Sij] for i>1, by cascading with the inverse matrix [S0]$^{-1}$ and save in matrices [Sij'], whereby [S1j']=[S1j], [Sij']=[S0]$^{-1}$×[Sij];

d) cascade s-parameters of all permutations of all capacitor settings of all matrices [Sij'] and save in a tuner calibration file ready for retrieval.

8. An interpolation algorithm for calculating the s-parameters of tuners calibrated as in claim 5 or 6, for any capacitor setting (cs) between calibrated points k, as follows:

a) calculate the four sets of s-parameters [Si·mn], {m,n}={1,2}) of each tuning section "i" (i=1, 2, 3 . . . ) between two successive calibrated capacitor settings (k, k+1), whereby k<cs<k+1, using linear interpolation for the real and imaginary part of each set of s-parameters [Si·mn(k)] and [Si·mn(k+1)], whereby k is the index of the calibrated point k=1, 2, 3, 4 . . . N, and N is the number of capacitor settings used in the calibration, b) cascade the interpolated s-parameter matrices of all tuning sections.

* * * * *